(12) United States Patent
Hairapetian

(10) Patent No.: US 7,312,639 B2
(45) Date of Patent: *Dec. 25, 2007

(54) UNIVERSAL SINGLE-ENDED PARALLEL BUS

(75) Inventor: Armond Hairapetian, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/591,406

(22) Filed: Nov. 1, 2006

(65) Prior Publication Data

US 2007/0046334 A1    Mar. 1, 2007

Related U.S. Application Data

(63) Continuation of application No. 10/856,476, filed on May 29, 2004, now Pat. No. 7,135,889, which is a continuation of application No. 10/179,735, filed on Jun. 24, 2002, now Pat. No. 6,753,700, which is a continuation of application No. 09/605,091, filed on Jun. 27, 2000, now Pat. No. 6,424,177.

(60) Provisional application No. 60/141,354, filed on Jun. 28, 1999.

(51) Int. Cl.
*H03K 19/094* (2006.01)
*H03K 19/0175* (2006.01)

(52) U.S. Cl. .................... 326/86; 326/90; 326/126
(58) Field of Classification Search ............ 326/82–83, 326/85, 86, 89, 90, 93, 56, 115, 126–127; 327/77–78, 102, 530, 552, 554
See application file for complete search history.

(56) References Cited

U.S. PATENT DOCUMENTS 5,512,853 A * 4/1996 Ueno et al. .................. 327/333
6,124,177 A * 9/2000 Lin et al. ..................... 438/305
6,184,717 B1 * 2/2001 Crick ............................ 326/86

FOREIGN PATENT DOCUMENTS

WO    WO 81/01780    6/1981

* cited by examiner

*Primary Examiner*—Anh Q. Tran
(74) *Attorney, Agent, or Firm*—Garlick Harrison & Markison; Shayne X. Short

(57) ABSTRACT

A high speed data communication system uses a single-ended bus architecture with a reference signal extracted from a differential periodic signal that is transmitted along with single-ended data. By using a periodic signal such a clock signal with approximately 50% duty cycle, a much more stable and accurate reference signal is established for receiving single-ended data.

20 Claims, 2 Drawing Sheets

UNIVERSAL SINGLE-ENDED PARALLEL BUS

CROSS REFERENCE TO RELATED APPLICATIONS

The present U.S. Utility Patent Application claims priority pursuant to 35 U.S.C. § 120, as a continuation, to the following U.S. Utility Patent Application which is hereby incorporated herein by reference in its entirety and made part of the present U.S. Utility Patent Application for all purposes:

1. U.S. Utility application Ser. No. 10/856,476, entitled "Universal single-ended parallel bus," filed May 29, 2004, now U.S. Pat. No. 7,135,889, which claims priority pursuant to 35 U.S.C. § 120, as a continuation, to the following U.S. Utility Patent Application which is hereby incorporated herein by reference in its entirety and made part of the present U.S. Utility Patent Application for all purposes:

2. U.S. Utility application Ser. No. 10/179,735, entitled "Universal single-ended parallel bus," filed Jun. 24, 2002, now U.S. Pat. No. 6,753,700 B2, issued on Jun. 22, 2004, which claims priority pursuant to 35 U.S.C. § 120, as a continuation, to the following U.S. Utility Patent Application which is hereby incorporated herein by reference in its entirety and made part of the present U.S. Utility Patent Application for all purposes:

3. U.S. Utility application Ser. No. 09/605,091, entitled "Universal single-ended parallel bus," filed Jun. 27, 2000, now U.S. Pat. No. 6,424,177 B1, issued on Jul. 23, 2002, which claims priority pursuant to 35 U.S.C. § 119(e) to the following U.S. Provisional Patent Application which is hereby incorporated herein by reference in its entirety and made part of the present U.S. Utility Patent Application for all purposes:

4. U.S. Provisional Application Ser. No. 60/141,354, entitled "Universal single-ended parallel bus," filed Jun. 28, 1999.

BACKGROUND OF THE INVENTION

The present invention relates in general to communication systems, and in particular to a communication system using single-ended parallel bus architecture for high speed data communication.

For high-speed chip to chip communication it is common to find both the clock and parallel data lines using fully differential architecture. The differential parallel bus architectures, however, requires twice the number of I/O's as compared to the single-ended bus architecture. To reduce the number of I/Os and bus interconnect lines it is desirable to use single-ended bus architectures. In high-speed communication systems, however, the signal swings are typically small, and in single-ended architectures it becomes necessary to define a reference signal which sets the threshold voltage of the I/O cells. This reference signal is used in both the transmitter as well as the receiver and is used to determine the logic state of the signal.

The use of a reference signal in a single-ended bus architectures works well as long as the reference voltage remains stable and accurate. Any variations in the reference signal results in duty cycle distortions. To improve the stability and accuracy of the reference signal, instead of having separate reference signal generators at each end of the channel (i.e., receiver and transmitter), the receiver is typically equipped with circuitry that extracts the reference level from the data. This method of reference extraction, however, still suffers from variations since the DC value of the received data can vary significantly depending on the data stream. There is therefore a need for data communication systems with improved single-ended bus structures.

SUMMARY OF THE INVENTION

The present invention provides a single-ended bus architecture for high speed data communication wherein a stable and accurate reference voltage minimizes duty cycle distortion. Broadly, a communication system according to the present invention includes a single-ended bus structure that is made up of a differential interconnect line that carries a differential periodic signal such as clock, and one or more single-ended data interconnect lines. The reference signal for the single-ended data lines is extracted from the differential clock signal. Given a clock signal with near 50% duty cycle, the stability of the extracted DC value is much improved.

Accordingly, in one embodiment, the present invention provides a communication system including a first integrated circuit configured to transmit data and a periodic signal; a bus coupled to the first integrated circuit, the bus having at least one differential interconnect line coupled to carry the periodic signal, and a single-ended interconnect line coupled to carry data; and a second integrated circuit configured to receive the data and the periodic signal, the second integrated circuit having a differential buffer coupled to receive the periodic signal and to extract a reference signal, and a data buffer coupled to receive the data and the reference signal.

In another embodiment, the present invention provides a method of communicating data including transmitting a differential periodic signal over differential lines in a communication bus; transmitting single-ended data over single-ended lines in the communication bus; and extracting a reference signal for the single-ended data from the differential periodic signal.

In yet another embodiment, the present invention provides an integrated circuit including a differential buffer coupled to receive a differential periodic signal and to extract a DC reference signal from the differential periodic signal; a data buffer coupled to receive a single-ended data and the reference signal, the data buffer being configured to determine a logic level of the single-ended data by comparing it to the reference signal.

The following detailed description and the accompanying drawings provide a better understanding of the nature and advantages of the method and circuitry for implementing a high speed communication system according to the present invention.

DESCRIPTION OF THE SPECIFIC EMBODIMENTS

The present invention provides a single-ended bus architecture for high speed data communication wherein a stable and accurate reference voltage minimizes duty cycle distortion. In many communication systems, the source of the data is the same circuit that supplies the clock signal. Thus, data and clock typically have the same logic levels (e.g., TTL, CMOS, etc.). Unlike data, however, clock is typically a signal with a 50% duty cycle and therefore has a much more stable DC value. According to a preferred embodiment of the present invention, the optimum reference voltage is extracted from the clock. This results in a much more accurate and stable reference voltage for use along with single-ended data lines.

Figure 1:
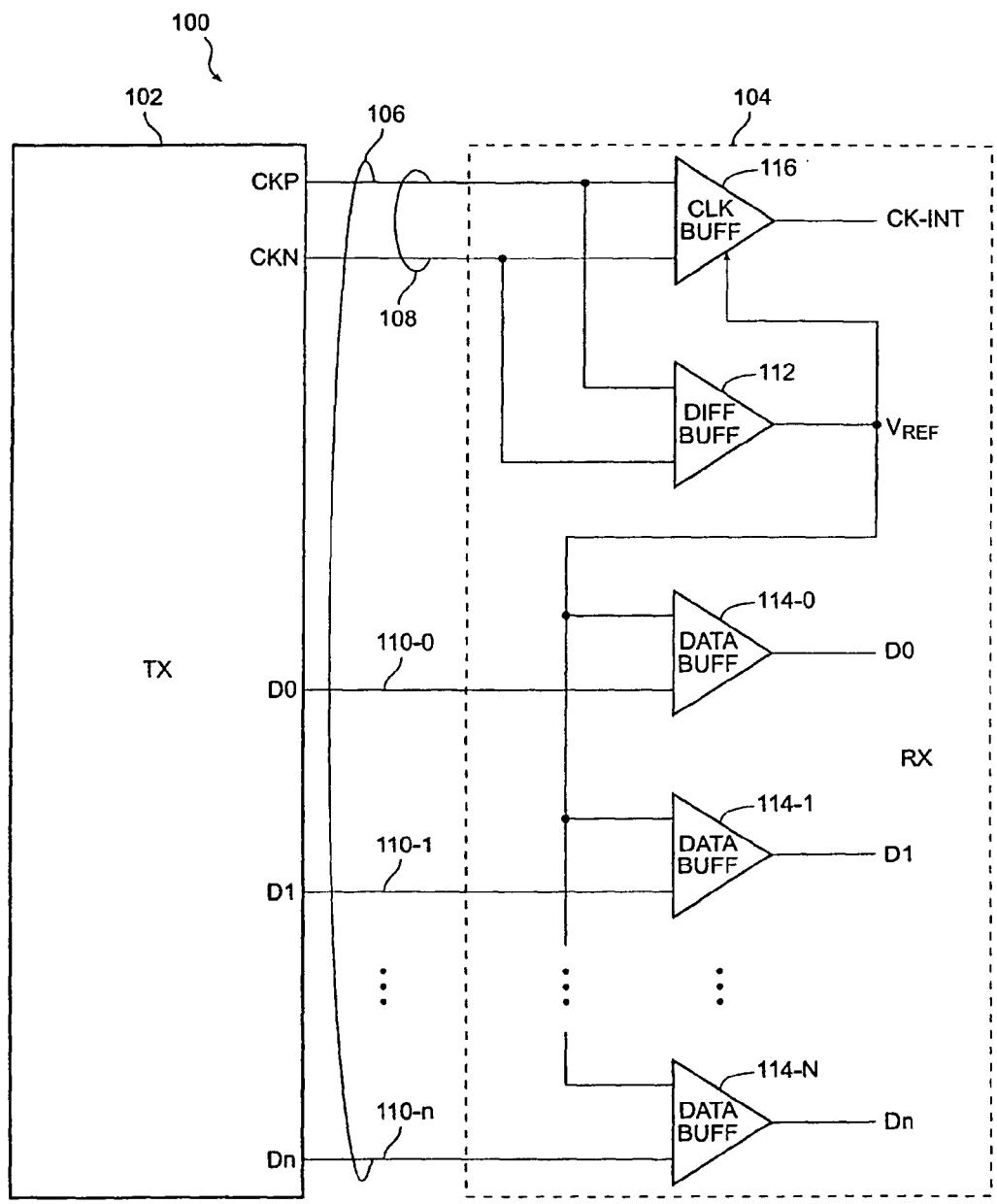
FIG. 1 is a high level block diagram of a communication system using the single-ended bus architecture according to the present invention.

FIG. 1 is a high level block diagram of a communication system 100 using the single-ended bus architecture according to the present invention. A transmitter integrated circuit (IC) 102 is connected to a receiver IC 104 via a communication bus 106. Integrated circuits 102 and 104 are identified herein as transmitter and receiver for simplicity, and may comprise other circuitry, for example, each being both a transmitter and a receiver (i.e., transceivers). In this embodiment, bus 106 has at least one differential line 108 which is used for carrying clock signal (CKN/CKP) with several other single-ended lines 110-0 to 110-n that carry data. Receiver IC 104 includes a differential buffer 112 that receives differential clock signal CKN/CKP and generates the reference signal $V_{REF}$ by extracting the DC value of the differential clock signal. Receiver IC 104 further includes data input buffers 114-0 to 114-n that receive data lines 110-0 to 110-n at their inputs, respectively. Each data input buffer 114-i is also supplied with the reference signal $V_{REF}$ generated by differential buffer 112. In one embodiment, the reference signal $V_{REF}$ is also supplied to a clock buffer 116 that is used to buffer the received differential clock signal CKN/CKP and to generate an internal clock signal CK_INT. Single-ended data is thus received and buffered using the reference signal extracted from the differential clock signal.

Figure 2:
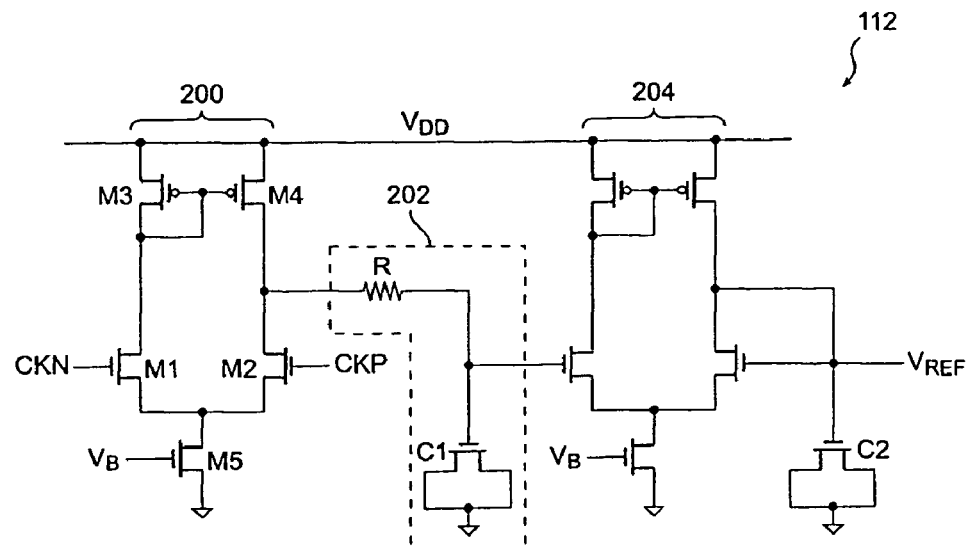
FIG. 2 shows a simplified circuit schematic for a reference signal extraction circuit according to an exemplary embodiment of the present invention.

Referring to FIG. 2, there is shown an exemplary circuit implementation for differential buffer 112 for extracting the reference signal $V_{REF}$ from the differential clock signal CKN/CKP. Buffer 112 includes an input differential pair 200 made-up of n-channel input MOS transistors M1 and M2 that receive the differential clock signal CKN/CKP at their respective gate terminals, p-channel load MOS transistors M3 and M4, and n-channel current-source MOS transistor M5. Differential clock signal CKN/CKP is buffered and amplified by input differential pair 200 at the output OUT1. Output OUT1 of input differential pair 200 is filtered by resistor R and capacitor C1 extracting the DC value of the differential clock signal. Resistor R may be made of any number of semiconductor materials such as polysilicon, and capacitor C1 may be made of any number of materials including, for example, an MOS structure as shown. A second differential pair 204 constructed similar to differential pair 200, provides buffering and generates $V_{REF}$ at its output.

Figure 3:
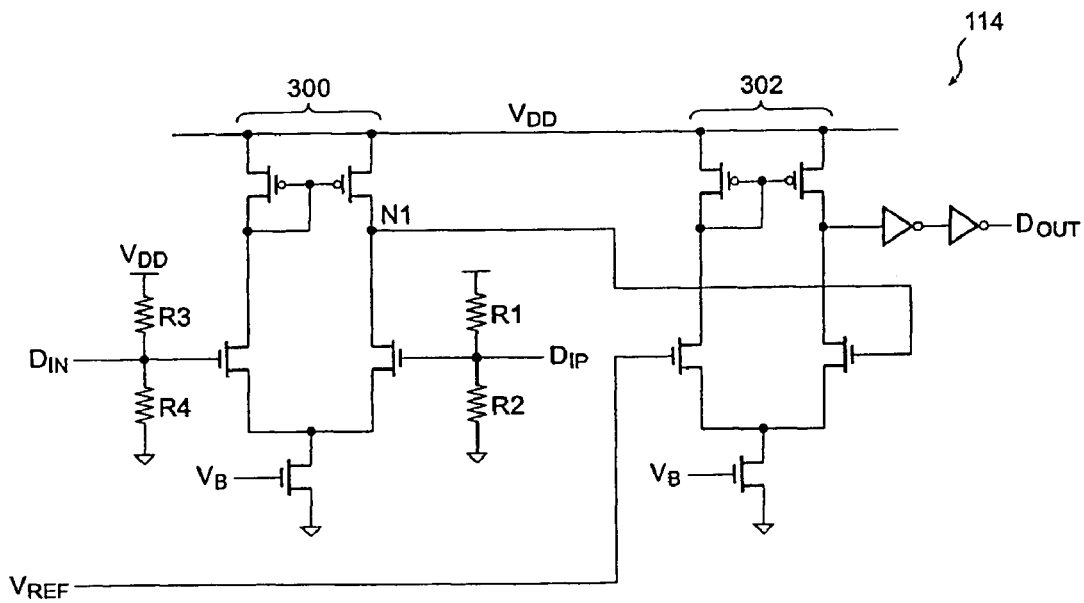
FIG. 3 is an exemplary circuit schematic for a data input buffer receiving single-ended data and the extracted reference signal.

FIG. 3 shows an exemplary circuit implementation for a data buffer according to the present invention. Data buffer 114 includes an input differential pair 300 that is capable of receiving either a differential data signal (Din and Dip) or a single-ended data signal (e.g., at input Dip). Resistors R1, R2, and R3, R4 respectively couple to the positive input Dip and negative input Din. These resistors provide for DC biasing of the input terminals. Once buffered by input differential pair 300, the data signal at the output node N1 is applied to one input of a comparator 302 that receives at another input the reference signal $V_{REF}$ extracted from the differential clock. By comparing the level of the data signal to $V_{REF}$, buffer 302 determines the logic level of the data signal. One or more inverters drive the output of comparator 302. It is to be understood that given a single-ended data line, data buffer 114 need not provide the capability to receive a differential signal. That is, input differential pair 300 may be a simple inverter receiving a single-ended signal.

The present invention thus provides a single-ended bus structure for high speed data communication systems wherein the reference signal is extracted from a differential periodic signal. The reference signal as thus extracted is much more stable and accurate minimizing distortion in the duty cycle of the data signal. While the above provides a complete description of specific embodiments of the present invention, it is possible to use various alternatives, modifications and equivalents. For example, while the differential signal has been identified as clock, the advantages of the present invention can be obtained with any periodic signal, whether defined as clock or another signal. Also, the number of differential and single-ended interconnect lines in the bus according to the present invention may vary depending on the system requirements. Therefore, the scope of the present invention should be determined not with reference to the above description but should, instead, be determined with reference to the appended claims, along with their full scope of equivalents.

What is claimed is:

1. A communication device, comprising:
  a first buffer that is operable to:
    receive a first signal; and
    process the first signal thereby extracting a clock signal from the first signal;
  a second buffer that is operable to:
    receive the first signal; and
    process the first signal thereby generating a processed signal; and
  a third buffer that is operable to:
    receive a second signal; and
    process the second signal and the processed signal that is generated by the second buffer thereby determining at least one bit value within the second signal.

2. The communication device of claim 1, wherein:
  the first signal is a differential signal.

3. The communication device of claim 1, wherein:
  the first buffer is a first differential buffer;
  the second buffer is a second differential buffer; and
  the third buffer is a third differential buffer.

4. The communication device of claim 1, wherein:
  the communication device is coupled to at least one additional communication device;
  the communication device is a receiver; and
  the at least one additional communication device is a transmitter.

5. The communication device of claim 1, wherein:
  the first buffer is a first differential buffer;
  the first signal is a differential signal;
  the communication device is coupled to at least one additional communication device;
  the communication device is a receiver;
  the at least one additional communication device is a transmitter; and the at least one additional communication device includes a second differential buffer that transmits the first signal.

6. The communication device of claim 1, wherein:
the data signal and the processed signal form a differential signal; and
the third buffer is a differential buffer that is operable to receive the differential signal.

7. The communication device of claim 1, wherein:
the communication device is an integrated circuit; and
the integrated circuit is coupled to at least one additional integrated circuit via at least one data line.

8. The communication device of claim 1, wherein:
the communication device is an integrated circuit; and
the integrated circuit is coupled to at least one additional integrated circuit via at least one differential signal line.

9. The communication device of claim 1, wherein:
the first buffer is operable to receive the processed signal from the second buffer.

10. The communication device of claim 1, wherein:
the first buffer is operable to employ the processed signal when extracting the clock signal from the first signal.

11. The communication device of claim 1, wherein:
at least one of the first buffer, the second buffer, and the third buffer includes a differential pair that includes:
a current source;
a first differential NMOS transistor having a source, gate, and drain, wherein the source of the first differential NMOS transistor is coupled to the current source; and
a second differential NMOS transistor having a source, gate, and drain, wherein the source of the second differential NMOS transistor is coupled to the current source.

12. The communication device of claim 1, wherein:
the first signal is a differential clock signal that is received by the communication device; and
the clock signal, that is generated from the differential clock signal, is an internal clock signal of the communication device.

13. A communication device, comprising:
a first buffer that is operable to:
receive a first signal, wherein the first signal is a differential signal; and
process the first signal thereby generating a processed signal; and
a second buffer that is operable to:
receive a second signal; and
process the second signal and the processed signal that is generated by the second buffer thereby determining at least one bit value within the second signal.

14. The communication device of claim 13, further comprising:
a third buffer that is operable to:
receive a differential signal; and
process the differential signal thereby extracting a clock signal from the differential signal.

15. The communication device of claim 13, further comprising:
a third buffer that is operable to:
receive a differential signal; and
employ the processed signal that is generated by the first buffer when processing the differential signal thereby extracting a clock signal from the differential signal.

16. The communication device of claim 13, wherein:
the communication device is an integrated circuit; and
the integrated circuit is coupled to at least one additional integrated circuit via at least one data line.

17. The communication device of claim 13, wherein:
the communication device is an integrated circuit; and
the integrated circuit is coupled to at least one additional integrated circuit via at least one differential signal line.

18. The communication device of claim 13, wherein:
at least one of the first buffer, the second buffer, and the third buffer includes a differential pair that includes:
a current source;
a first differential NMOS transistor having a source, gate, and drain, wherein the source of the first differential NMOS transistor is coupled to the current source; and
a second differential NMOS transistor having a source, gate, and drain, wherein the source of the second differential NMOS transistor is coupled to the current source.

19. A communication system, comprising:
a first integrated circuit that is operable to transmit a differential signal;
a second integrated circuit that is operable to:
receive the differential signal;
process the differential signal thereby extracting a clock signal from the differential signal; and wherein:
the first integrated circuit is operable to transmit data to the second integrated circuit; and
the second integrated circuit is operable to employ the differential signal to determine bit values within the data that is transmitted thereto from the first integrated circuit.

20. The communication device of claim 19, wherein:
at least one of the first integrated circuit and the second integrated circuit includes a differential pair that includes:
a current source;
a first differential NMOS transistor having a source, gate, and drain, wherein the source of the first differential NMOS transistor is coupled to the current source; and
a second differential NMOS transistor having a source, gate, and drain, wherein the source of the second differential NMOS transistor is coupled to the current source.

* * * * *